(12) United States Patent
Funaba (10) Patent No.: US 7,038,498 B2
(45) Date of Patent: May 2, 2006

(54) INPUT/OUTPUT CIRCUIT, REFERENCE-VOLTAGE GENERATING CIRCUIT, AND SEMICONDUCTOR INTEGRATED CIRCUIT

(75) Inventor: Seiji Funaba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/000,005

(22) Filed: Dec. 1, 2004

(65) Prior Publication Data
US 2005/0077953 A1 Apr. 14, 2005

Related U.S. Application Data

(62) Division of application No. 10/279,817, filed on Oct. 25, 2002, now Pat. No. 6,853,213.

(30) Foreign Application Priority Data
Oct. 29, 2001 (JP) .............................. 2001-331397

(51) Int. Cl.
*H03K 5/22* (2006.01)
(52) U.S. Cl. ......................................... 327/77; 326/30
(58) Field of Classification Search ................... 326/30; 327/77, 89, 108, 109, 111, 112, 530, 534, 327/535, 538, 543
See application file for complete search history.

(56) References Cited

U.S. PATENT DOCUMENTS

| | | | |
|---|---|---|---|
| 4,859,877 A | 8/1989 | Cooperman et al. | |
| 5,602,494 A | 2/1997 | Sundstrom | |
| 5,644,255 A * | 7/1997 | Taylor | 326/81 |
| 5,848,101 A * | 12/1998 | Taylor | 375/257 |
| 6,054,881 A | 4/2000 | Stoenner | |
| 6,411,122 B1 | 6/2002 | Mughal et al. | |
| 6,625,206 B1 * | 9/2003 | Doblar | 375/219 |

FOREIGN PATENT DOCUMENTS

| | | |
|---|---|---|
| JP | H03-116214 A | 5/1991 |
| JP | 7-86909 | 3/1995 |
| JP | H08-162930 A | 6/1996 |
| JP | H08-162942 A | 6/1996 |
| JP | 9-83411 | 3/1997 |
| JP | H11-085345 A | 3/1999 |

* cited by examiner

*Primary Examiner*—Jeffrey Zweizig
(74) *Attorney, Agent, or Firm*—Sughrue Mion, PLLC (57) ABSTRACT

Disclosed is an input/output circuit having a terminating circuit that contributes to a smaller chip area. The input/output includes an output buffer having a first series circuit, which comprises a first transistor and a resistor and a second series circuit, which comprises a second transistor and a resistor, connected in parallel between a high-potential power supply and an input/output pin, as well as a third series circuit, which comprises a third transistor and a resistor and a fourth series circuit, which comprises a fourth transistor and a resistor, connected in parallel between the input/output pin and a low-potential power supply. The input/output circuit further includes an input buffer having an input terminal connected to the input/output pin, and a control circuit which, at the time of a signal output, performs control for supplying a signal, which is obtained by inverting the logic of output data, to gates of the first to fourth transistors, and which, at the time of a signal input, performs control for supplying the gates of the first and third transistors with the high-potential power supply voltage and low-potential power supply voltage, respectively, and the gates of the second and fourth transistors with the low-potential power supply voltage and high-potential power supply voltage, respectively.

7 Claims, 9 Drawing Sheets

| C1 | C2 | C3 | DQ |
|---|---|---|---|
| L | L | L | data (OUTPUT RESISTOR: 50 OHMS) |
| H | L | H | Active termination (TERMINATING RESISTOR: 50 OHMS) |
| H | L | L | Open (Hi-Z) |

INPUT/OUTPUT CIRCUIT, REFERENCE-VOLTAGE GENERATING CIRCUIT, AND SEMICONDUCTOR INTEGRATED CIRCUIT

This is a divisional of application Ser. No. 10/279,817 filed Oct. 25, 2002. The entire disclosure of the prior application, application Ser. No. 10/279,817 which issued as U.S. Pat. No. 6,853,213, is considered part of the disclosure of the accompanying divisional application and is hereby incorporated by reference.

FIELD OF THE INVENTION

This invention relates to a bi-directional input/output interface for a signal input and output and, more particularly, to a termination of a transmission line and to a reference-voltage generating circuit.

BACKGROUND OF THE INVENTION

In a high-speed logic circuit in which signal rise and fall times are short, there are instances where it becomes necessary to treat a signal line as a transmission line of a distributed-constant circuit. For example, reflection must be taken into account when the propagation delay time of a transmission line is large in comparison with the rise and fall times of the output signal. That is, when a circuit having impedance different from the characteristic impedance of a transmission line is connected to the transmission line, reflection is produced at the point of connection. As is well known, a reflection coefficient $\rho 1$ at the receiving end is given by the following equation:

$$\rho 1 = (ZL - Z0)/(ZL + Z0)$$

where Zs represents the output impedance of a signal source. Accordingly, if the transmission line whose characteristic impedance is Z0 is terminated at ZL=Z0 or Zs=Z0, reflection can be avoided.

Figure 9:
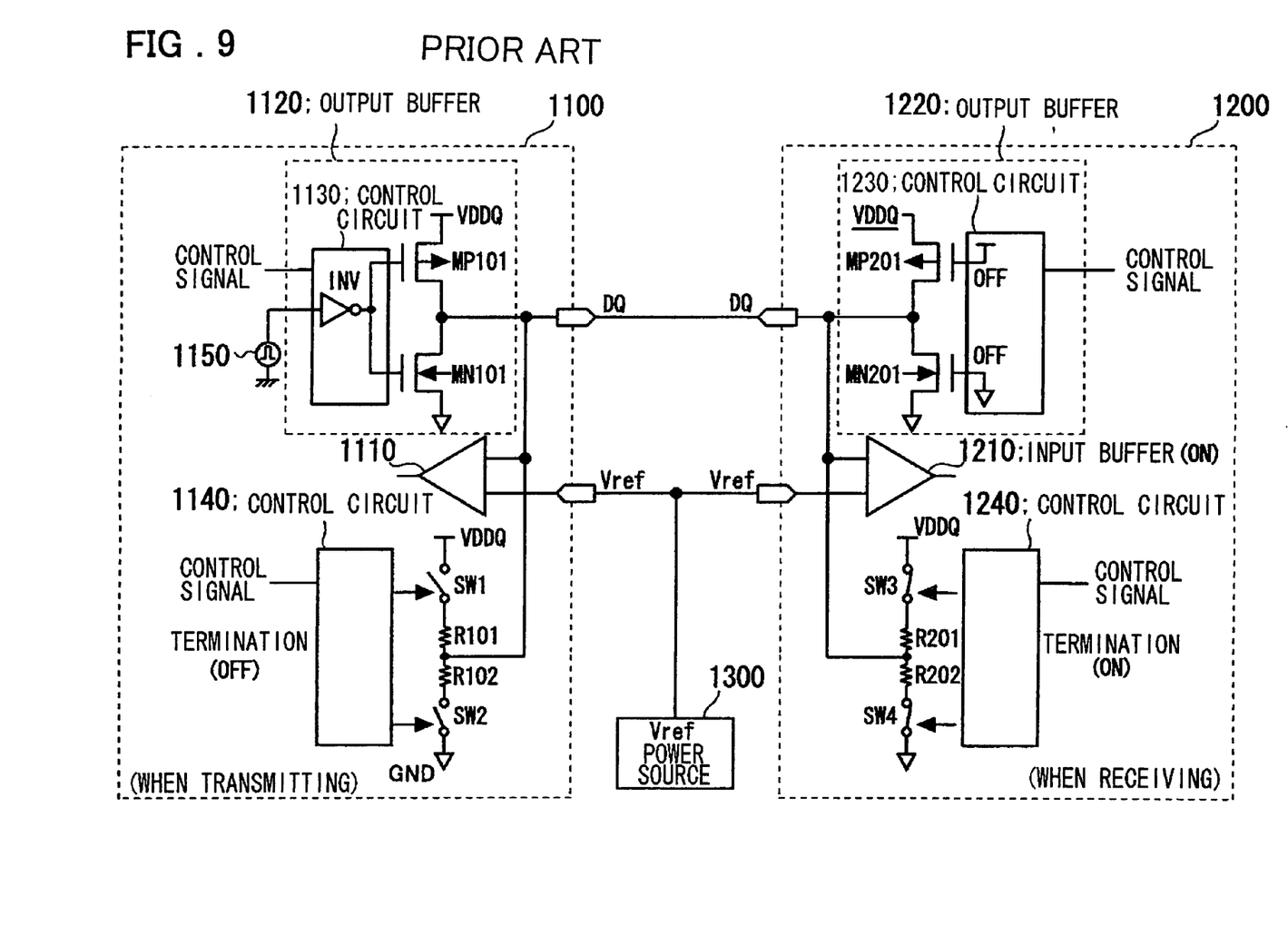
FIG. 9 is a diagram illustrating an example of a conventional interface having a terminating circuit.

FIG. 9 is a diagram schematically illustrating an input/output interface in a semiconductor integrated circuit. This shows the structure of a conventional input/output circuit so adapted that terminating resistors are connected to a signal line when the mode is the input mode. As shown in FIG. 9, this circuit includes a first input/output circuit 1100, a second input/output circuit 1200, which is connected to the first input/output circuit 1100 by wiring, for sending and receiving signals, and a reference voltage source 1300.

The first input/output circuit 1100 has an input circuit (input buffer) 1110 and an output circuit (output buffer) 1120 whose input and output ends, respectively, are connected to an input/output terminal (I/O pin) DQ that sends and receives signals bi-directionally to and from an external circuit (the circuit 1200 in FIG. 9). The first input/output circuit 1100 includes, as a termination, a control circuit 1140, terminating resistors R101 and R102 each having one end connected to the input/output pin DQ, and switches SW1 and SW2 connected between the other ends of the resistors R101 and R102 and a high-potential power supply VDDQ and low-potential power supply GND, respectively.

Assume that the first input/output circuit 1100 has been placed in the output mode (transmit mode) and that the output buffer 1120 is in the output-enable state. The output buffer 1120 includes a control circuit 1130 the inputs to which are a control signal that controls input/output and data that arrives from a data source 1150, and a CMOS inverter. The CMOS inverter comprises a P-channel MOS transistor MP101 and an N-channel MOS transistor MN101 having gates connected in common with the output of the control circuit 1130, drains tied together and connected to the input/output pin DQ, and sources connected to the high-potential power supply VDDQ and low-potential power supply GND, respectively. The data source 1150 represents an internal circuit (not shown) that supplies the control circuit 1130 of the first input/output circuit 1100 with data that is to be output from the input/output pin DQ.

The input buffer 1110 has first and second input terminals supplied respectively with an input signal from the input/output pin DQ and a reference voltage Vref from the reference voltage source 1300. The input buffer 1110 differentially amplifies a voltage between the input signal and the reference voltage Vref by an input differential pair (not shown) and outputs, to the internal circuit (not shown), a signal having a logic value that corresponds to the magnitude relationship between the input signal and reference voltage Vref. It should be noted that an arrangement might be adopted in which the input buffer 1110 are set to the OFF state when the operating mode is the output mode.

The second input/output circuit 1200 has an input circuit (input buffer) 1210 and an output circuit (output buffer) 1220 whose input and output ends, respectively, are connected to an input/output pin DQ). The second input/output circuit 1200 includes, as a termination, a control circuit 1240, terminating resistors R201 and R202 each having one end connected to the input/output pin DQ, and switches SW3 and SW4 connected between the other ends of the resistors R201 and R202 and the high-potential power supply VDDQ and low-potential power supply GND, respectively.

The output buffer 1220 has a structure similar to that of the output buffer 1120. In the example of the circuit connection shown in FIG. 9, however, the second input/output circuit 1200 is in the input mode (receive mode) and therefore the output thereof has been set in a state of high impedance. More specifically, the output buffer 1220 includes a control circuit 1230 and a CMOS inverter. The latter comprises a P-channel MOS transistor MP201 and an N-channel MOS transistor MN201 having gates connected in common with the output of the control circuit 1230, drains tied together and connected to the input/output pin DQ, and sources connected to the high-potential power supply VDDQ and low-potential power supply GND, respectively. The gate of the MOS transistor MP201 is connected to the high-potential power supply VDDQ, and the gate of the MOS transistor MN201 is connected to the low-potential power supply GND. Both of these transistors are in the OFF state.

The input buffer 1210 has first and second input terminals supplied respectively with an input signal from the input/output pin DQ and the reference voltage Vref from the reference voltage source 1300. The input buffer 1210 differentially amplifies a voltage between the input signal and the reference voltage Vref by an input differential pair (not shown) and outputs, to an internal circuit (not shown), a signal having a logic value that corresponds to the size relationship between the input signal and reference voltage Vref. It should be noted that the high potential power supply VDDQ of the input/output circuits is a power supply voltage for driving the pin DQ to the high level. Furthermore, it is not necessarily required that the internal circuit of the semiconductor integrated circuit be driven by the power supply VDDQ, and there are cases where use is made of another power supply, e.g., an internal power supply voltage obtained by stepping down VDDQ to a lower voltage.

As mentioned above, FIG. 9 illustrates an arrangement for a case where the first input/output circuit 1100 is transmitting data and the second input/output circuit 1200 is receiving data. The control circuit 1130 in the output buffer 1120 generates a signal that is the result of inverting the data from the data source 1150 by an inverter INV and supplies this signal to the CMOS inverter (composed of MP101 and MN101).

Further, the control circuit 1140 turns off the switch SW1 between the terminating resistor R101 and high-potential power supply VDDQ and the switch SW2 between the terminating resistor R102 and low-potential power supply GND, whereby the resistors R101 and R102 are disconnected from the line that is connected to the pin DQ.

In the second input/output circuit 1200 at receive time, on the other hand, the control circuit 1230 receives a control signal (output disable) and sets the gate of the P-channel MOS transistor MP201 to the high-potential power supply voltage VDDQ and the gate of the N-channel MOS transistor MN201 to the low-potential power supply voltage GND, thereby placing both of these transistors in the OFF state. Further, the input buffer 1210 is set in the ON state. Further, the control circuit 1240 turns on the switch SW3 between the resistor R201 and high-potential power supply VDDQ and the switch SW4 between the resistor R202 and low-potential power supply GND, whereby the resistors R201 and R202 are connected to the line that is connected to the pin DQ. Thus the circuit operates as a terminating circuit.

The specification of Japanese Patent Kokai Publication JP-A-9-83411 discloses the structure of a semiconductor integrated circuit so adapted that a transmission line will not be terminated when an output drive circuit is driving and controlling a potential on an input/output pad. This circuit serves as an active terminating circuit, which occupies a small area, for avoiding contention with a terminating operation at the time of data output and performing a terminating operation at the time of data reception. This arrangement is such that the terminating circuit that terminates a transmission line connected to an input/output pad is provided separate from an input/output circuit comprising an input buffer circuit and an output buffer circuit. This arrangement is substantially equivalent to the conventional interface circuit described above with reference to FIG. 9.

Further, the specification of U.S. Pat. No. 5,602,494 discloses the structure of a bi-directional programmable I/O cell that functions in a data transmission mode and active termination mode.

SUMMARY OF THE DISCLOSURE

In the conventional circuit described above with reference to FIG. 9, the input/output circuit comprises the output circuit (output buffer), input circuit (input buffer) and terminating circuit, and the terminating circuit and output circuit are separate from each other. A circuit implementation in which circuits that occupy a comparatively large area, namely the output circuit and terminating circuit, are provided separately of each other invites an increase in chip area. In other words, in the case of a multiple-pin semiconductor integrated circuit in which the number of terminating circuits increases in correspondence with the number of input/output pins and high-speed signals are input and output, there in an increase in the area occupied by the terminating circuits and output circuits and, hence, an increase in the chip area.

Further, in the conventional circuit, the transmitted signal in the output circuit is reflected again owing to mismatch of impedance with respect to the signal source of the line.

Furthermore, in the conventional circuit described above, the arrangement is such that the input buffer is supplied with the reference voltage from a reference-voltage source that is external to the chip. In the input buffer, it is required that the logical threshold voltage and reference voltage coincides. However, in the conventional circuit in which the reference voltage is supplied from a reference-voltage source exterior to the chip, a mismatch occurs between the reference voltage from the reference-voltage source and the logical threshold value when there is a discrepancy in the logical threshold value owing to a difference from one chip to another owing to the manufacturing process. As a consequence, there is a shift in the timing at which a signal is input to the internal circuit from the input circuit, and timing error such as clock duty error and clock skew can occur.

Accordingly, it is an object of the present invention to provide an input/output circuit having a terminating circuit that holds down an increase in area occupied, as well as a semiconductor integrated circuit having this input/output circuit.

Another object of the present invention is to provide a reference-voltage generating circuit through which a logical threshold value and reference voltage are made to agree, as well as a semiconductor integrated circuit having this reference-voltage generating circuit.

According to the present invention, the foregoing object is attained by providing an input/output circuit in which an output circuit, which includes at least a series circuit comprising a transistor and a resistor between an input/output pin and a power supply, has means for turning on the transistor at the time of a signal input, thereby causing the series circuit to operate as a terminating circuit of a line connected to the input/output pin.

More specifically, according to one aspect of the present invention, the foregoing objects are attained by providing an input/output circuit that includes an output circuit and an input circuit having an output end and an input end, respectively, connected to an input/output pin, wherein the output circuit has a first series circuit comprising a first transistor and a first resistor connected serially between a high-potential power supply and the input/output pin, a second series circuit comprising a second transistor and a second resistor connected serially between the input/output pin and a low-potential power supply, and control means, to which a control signal for controlling input/output is applied, for turning on both the first and second transistors based upon the control signal at the time of a signal input, thereby causing the first and second series circuits to operate as a terminating circuit; and for turning one of the first and second transistors on and the other off based upon the control signal in accordance with a logic value of a signal, which is to be output from the input/output pin, at the time of a signal output, thereby causing the first and second series circuits to operate as an output buffer.

According to another aspect of the present invention, the foregoing objects are attained by providing a reference-voltage generating circuit for supplying a reference voltage to an input buffer, to which an input signal from an input terminal and the reference voltage are differentially input, for differentially amplifying the input signal and reference voltage and outputting the result, the reference-voltage generating circuit including a first series circuit comprising a first transistor and a first resistor connected serially between a high-potential power supply and an output terminal, and a second series circuit comprising a second transistor and a second resistor connected serially between the output terminal and a low-potential power supply; the first and second transistors being turned on to output the reference voltage from the output terminal.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 1A and 1B are circuit diagrams useful in describing a first embodiment of the present invention, in which FIG. 1A illustrates an implementation at the time of an output and FIG. 1B an implementation at the time of an input;

FIGS. 8A and 8B are diagrams illustrating an example of a memory device according to a sixth embodiment of the present invention, in which FIG. 8A is a perspective view and FIG. 8B a sectional view of a printed circuit board.

PREFERRED EMBODIMENTS OF THE INVENTION

Preferred embodiments of the present invention will be described with reference to the drawings.

According to the present invention, an output circuit that includes a series circuit comprising a transistor and a resistor between an input/output pin (DQ in FIGS. 1A and 1B) and a power supply has control means (20 in FIGS. 1A and 1B) for turning on the transistor based upon a control signal at the time of a signal input from the input/output pin to an input circuit (10 in FIGS. 1A and 1B), thereby causing the series circuit to operate as a terminating circuit of a line connected to the input/output pin (DQ).

Figure 1A:
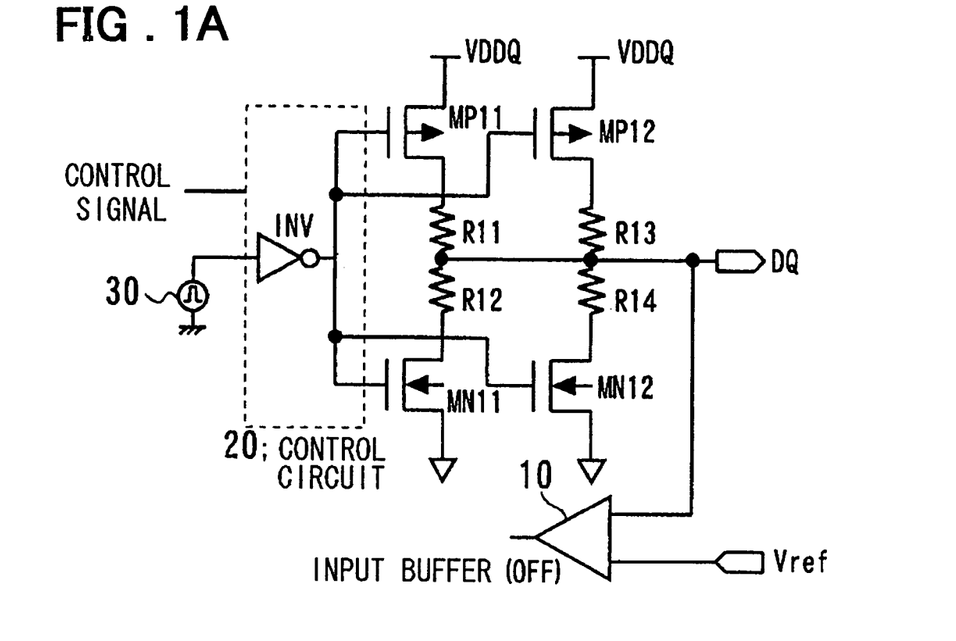
Figure 1B:
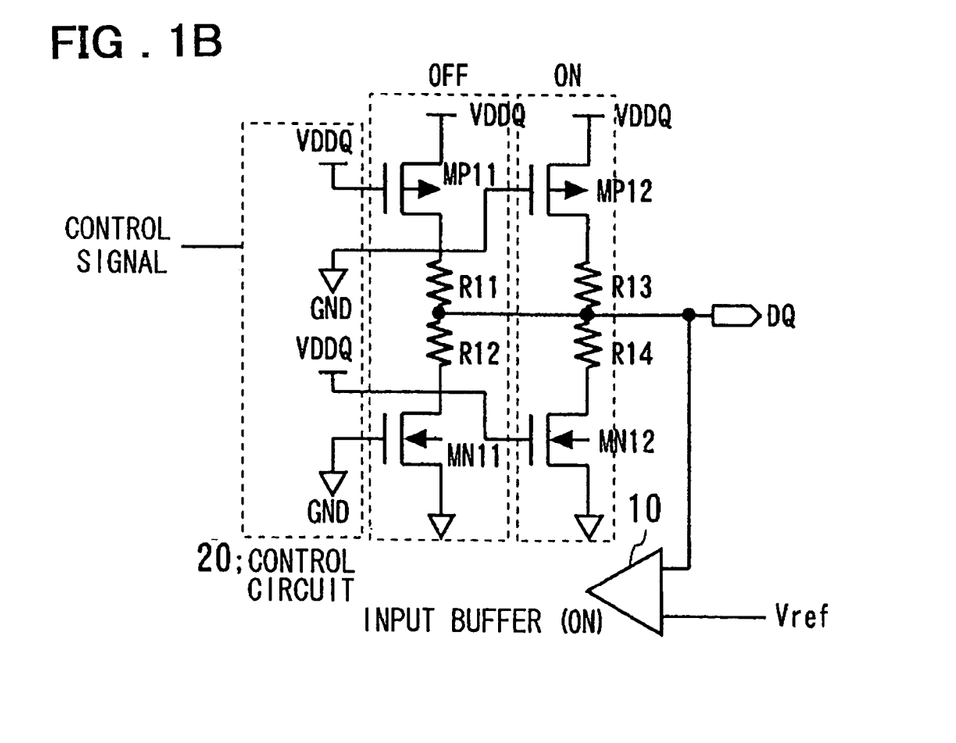

More specifically, in an embodiment of the present invention, a shown in FIGS. 1A and 1B, an input/output circuit includes an output circuit and an input circuit having an output end and an input end, respectively, connected to an input/output pin (DQ). The input/output circuit includes a first series circuit comprising a first transistor (MP12) and a first resistor (R13) connected serially between the input/output pin (DQ) and a high-potential power supply (VDDQ), and a second series circuit comprising a second resistor (R14) and second transistor (MN12) connected serially between the input/output pin (DQ) and a low-potential power supply (GND). Further provided is a control circuit (20) for controlling input and output.

In this embodiment of the present invention, the control circuit (20) turns on the first and second transistors (MP12 and MN12) based upon the input/output control signal when the operating mode is the input mode, whereby the first and second series circuits act as a terminating circuit that terminates a line connected to the input/output pint (DQ). When the operating mode is the output mode, the control circuit (20) turns one of the first and second transistors (MP12 and MN12) on and the other off based upon the logic value of data output from the input/output pin (DQ), thereby causing the first and second series circuits to operate as an output buffer.

In this embodiment of the invention, the output circuit has an output drive circuit (a circuit comprising a transistor MP11, resistors R11 and R12 and a transistor MN11), which is connected in parallel with the first series circuit (MP12 and R13) and second series circuit (MN12 and R14), the output whereof is set in a high impedance based upon the control signal at the time of a signal input.

Thus, in this embodiment of the present invention, at least part of the output circuit of the input/output circuit functions as an output buffer in the output mode and as a terminating circuit in the input mode, whereby the functions of an output circuit and terminating circuit are performed by a common circuit. This makes it possible to reduce the area occupied by the output circuit and terminating circuit.

Figure 4:
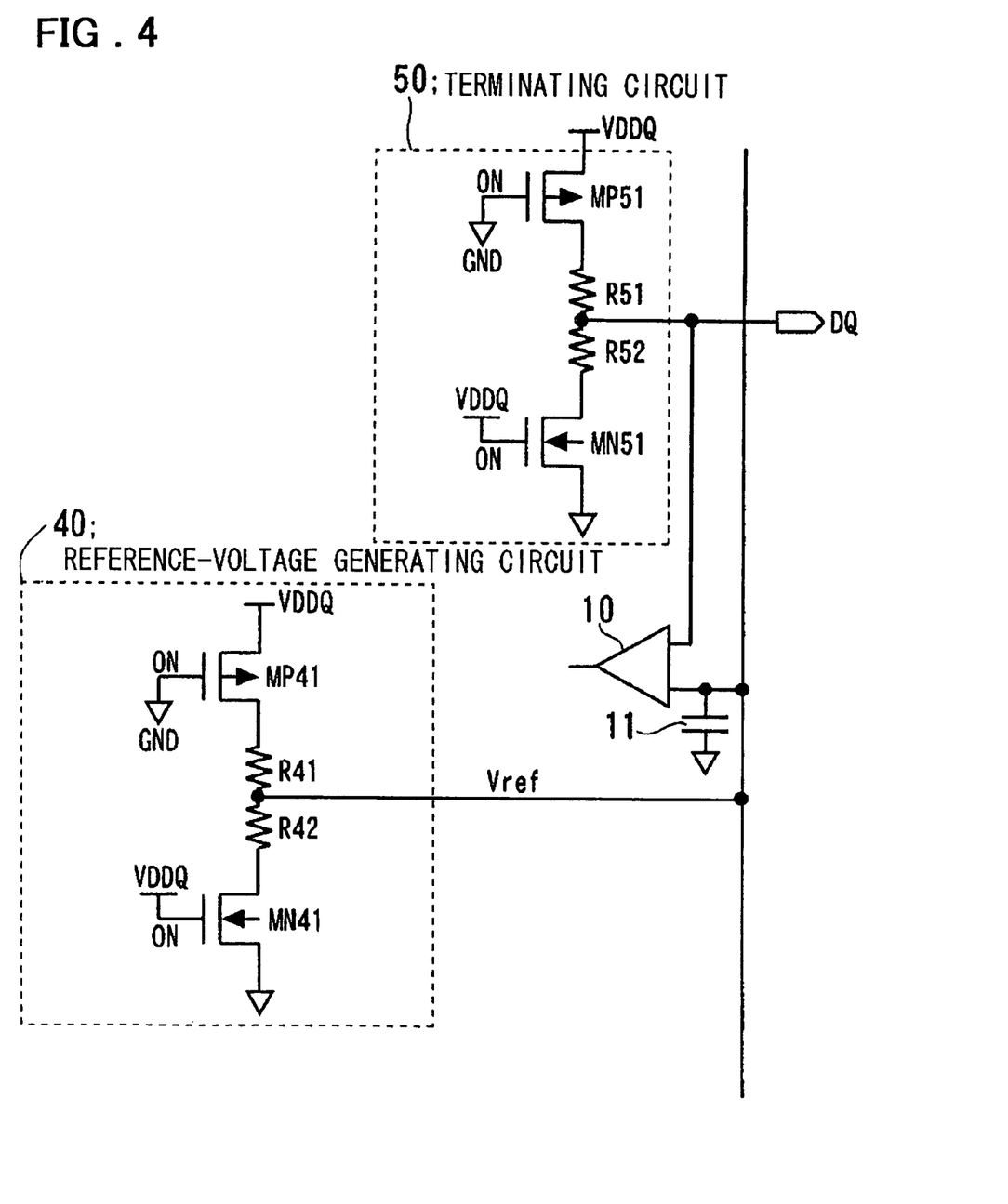
FIG. 4 is a circuit diagram illustrating the structure of a reference-voltage generating circuit according to a second embodiment of the present invention.

In another embodiment of the present invention, means are provided for generating a voltage equal to a voltage, which prevails in the absence of an applied signal, at the point of connection between the input/output pin (DQ) and the first and second series circuits constituting the terminating circuit, and for supplying this voltage to the input circuit as the reference voltage Vref. More specifically, as shown in FIG. 4, a reference-voltage generating circuit, for supplying a reference voltage to an input buffer which receives an input signal from an input terminal and the reference voltage differentially, includes a first series circuit comprising a first transistor (MP41) and a first resistor (R41) connected serially between a high-potential power supply (VDDQ) and a reference-voltage output terminal constituting an output node, and a second series circuit comprising a second resistor (R42) and a second transistor (MN41) connected serially between the reference-voltage output terminal and a low-potential power supply (GND). The first and second transistors (MP41 and MN41) are turned on to output the reference voltage Vref from the reference-voltage output terminal.

In this embodiment of the present invention, the voltage at the connection node between the input terminal and terminating resistor in the terminating circuit is supplied to the input circuit as the reference voltage. As a result, the reference voltage can be made to follow up a fluctuation in the logic threshold value of the signal from the input terminal, thereby diminishing shift and error in the timing of the input signal.

Embodiments of the present invention will now be described in greater detail with reference to the drawings.

FIGS. 1A and 1B are circuit diagrams useful in describing a first embodiment of the present invention, in which FIG. 1A illustrates the circuit connections at the time of signal transmission from the input/output circuit (i.e., in the output mode) and FIG. 1B the circuit connections at the time of signal reception (i.e., in the input mode). The output and input modes are decided by a command from a host device (not shown), and a control signal for controlling input/output is set to a logical value that is in accordance with the output or input mode. The method of generating the control signal is not directly related to the gist of the present invention and need not be described.

Referring to FIG. 1A, data from a data source 30 and a control signal for controlling input/output are supplied to a control circuit 20. When the control signal is indicative of the output mode, the control circuit 20 outputs a signal obtained on inverting the data by an inverter INV. The input/output circuit includes P-channel MOS transistors MP11 and MP12 having sources connected in common with the high-potential power supply VDDQ; resistors R11 and R12 connected between drains of the P-channel MOS transistors MP11 and MP12, respectively, and the input/output pin DQ; N-channel MOS transistors MN11 and MN12 having sources connected in common with the low-potential power supply GND; and resistors R12 and R14 connected between the drains of the N-channel MOS transistors MN11 and MN12, respectively, and the input/output pin DQ. The inverter INV has an output terminal connected in common with the gates of the P-channel MOS transistors MP11 and MP12 and N-channel MOS transistors MN11 and MN12.

An input buffer 10, which has a first input terminal connected to the input/output pin DQ and a second input terminal to which the reference voltage Vref is supplied, is in the ON state in the output mode.

The data source (signal source) 30 represents an internal circuit (not shown) that supplies the control circuit 20 with data that is to be output from the input/output pin DQ via the output buffer.

When the entered data is at the high level, the output of the inverter INV falls to the low level, both of the P-channel MOS transistors MP11 and MP12 for high-level drive turn on (the N-channel MOS transistors MN11 and MN12 turn off) and the input/output pin DQ is charged to the high-potential power supply VDDQ side via the parallel-connected resistors R11 and R13, whereby the input/output pin DQ rises to the high level.

When the entered data is at the low level, the output of the inverter INV rises to the high level, both of the N-channel MOS transistors MN11 and MN12 for low-level drive turn on (the P-channel MOS transistors MP11 and MP12 turn off) and the input/output pin DQ is discharged to the low level via the parallel-connected resistors R12 and R14, whereby the input/output pin DQ falls to the low level. The resistors R11 and R12 have substantially equal resistance values, and the same holds true for the resistors R13 and R14. These resistors are formed, e.g., by diffused resistors or thin-film resistors (polysilicon resistors).

In an output buffer to which a terminating circuit has been added, an increase in current consumption can be suppressed without changing the output voltage of the output buffer by holding constant the size ratio of a P-channel MOS transistor to an N-channel MOS transistor (e.g., the channel width ratio WP/WN) and reducing the values of the respective channel widths.

Next, as shown in FIG. 1B, in the input mode the control circuit 20 receives the control signal, connects the gate of the P-channel MOS transistor MP11 to the high-potential power supply VDDQ and the gate of the N-channel MOS transistor MN11 to the low-potential power supply GND, thereby turning off both of these MOS transistors MP11 and MN11, and connects the gate of the P-channel MOS transistor MP12 to the low-potential power supply GND and the gate of the N-channel MOS transistor MN12 to the high-potential power supply VDDQ, thereby turning on both of these MOS transistors MP12 and MN12 and turning on the terminating circuit (referred to also as an "active terminating circuit") comprising the MOS transistor MP12, resistors R13, R14 and MOS transistor MN12. As a result, the line connected to the input/output pin DQ is terminated.

The control circuit 20 to which the control signal and data signal are supplied has a basic circuit arrangement that performs a switching operation such that when the control signal indicates the output mode, the signal obtained on inverting the data from the data source 30 by the inverter is output and delivered commonly to the gates of the MOS transistors MP11, MP12, MN11, and MN12, whereas when the control signal indicates the input mode, the voltage of the high-potential power supply VDDQ is supplied to the gates of the MOS transistors MP11 and MN12 and the voltage of the low-potential power supply GND is supplied to the gates of the MOS transistors M12 and MN11. For example, the control circuit 20 comprises a first selector and a second selector(not shown). The output of the inverter INV and the high-potential power supply voltage VDDQ are supplied to the first selector, the output thereof is connected in common with the gates of the MOS transistors MP11 and MN12, and the control signal is applied as a selection control signal. The first selector selectively delivers the output of the inverter INV when the control signal indicates the output mode and selectively outputs the high-potential power supply voltage VDDQ when the control signal indicates the input mode. The output of the inverter INV and the low-potential power supply voltage GND are supplied to the second selector, the output thereof is connected in common with the gates of the MOS transistors MP12 and MN11, and the control signal is applied as a selection control signal. The second selector selectively delivers the output of the inverter INV when the control signal indicates the output mode and selectively outputs the low-potential power supply voltage GND when the control signal indicates the input mode.

The input buffer 10 may comprise a buffer circuit having an input differential pair (not shown) for differentially amplifying a voltage between the input signal and reference voltage Vref supplied to its first and second input terminals, respectively. By way of example, the buffer circuit outputs a signal of logic value "1" when the input signal is equal to or greater than the reference voltage Vref, and outputs a signal of logic value "0" when the input signal is less than the reference voltage Vref. A constant-current source that drives the input differential pair is turned off when the control signal indicates the output mode.

Figure 2:
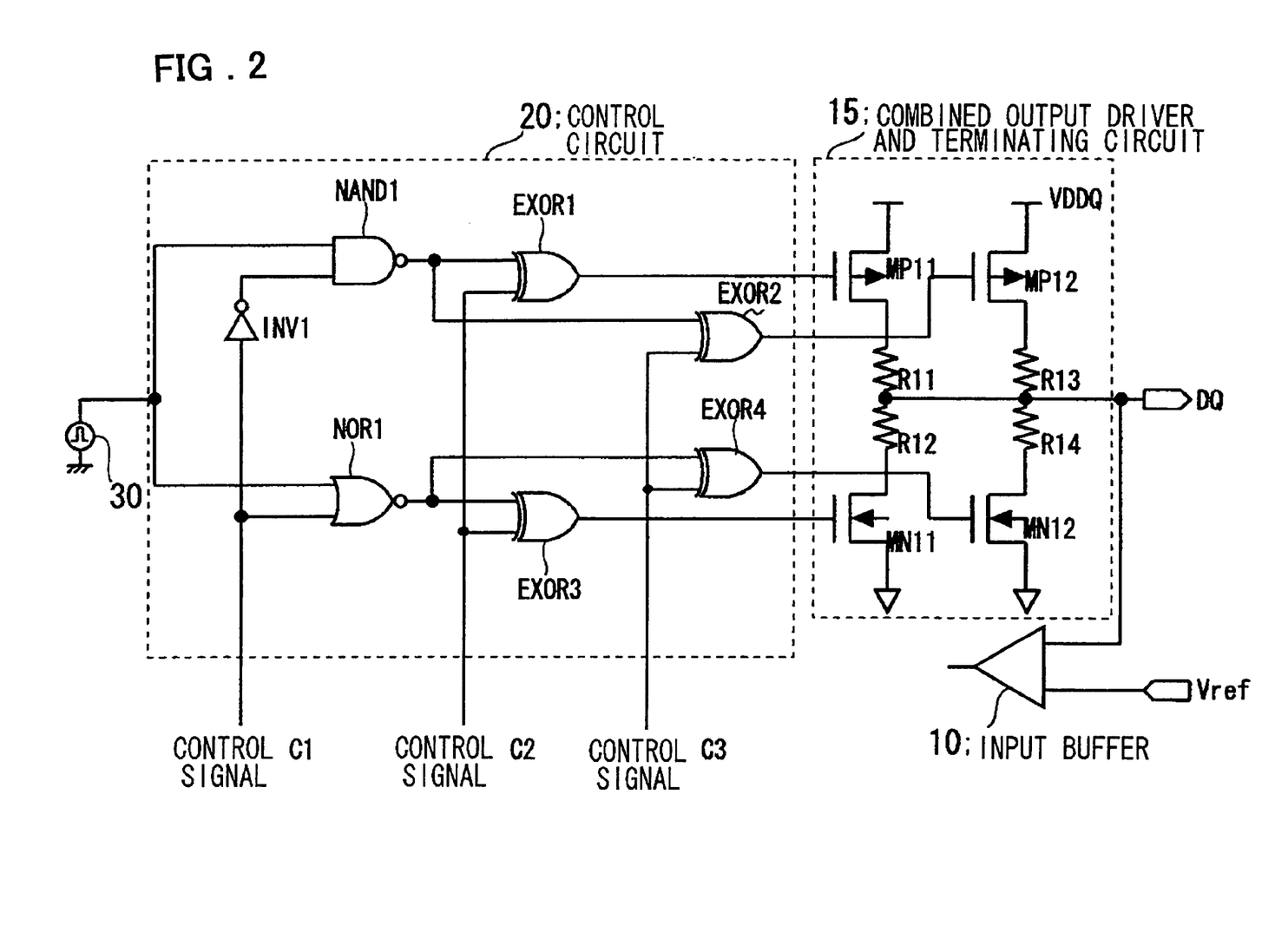
FIG. 2 is a circuit diagram showing the structure of a control circuit according to the first embodiment.

FIG. 2 is a diagram illustrating a specific example of the structure of the control circuit 20 according to the first embodiment. Here signals C1 to C3 are applied to the control circuit 20 as control signals. On the basis of the control signals C1, C2 and C3, a combined output driver (buffer) and terminating circuit 15 is set to a data output mode, terminating mode and high-impedance (open) state, respectively.

More specifically, as shown in FIG. 2, the control circuit 20 includes a NAND gate NAND1 having first and second input terminals to which data from the data source 30 and an inverted signal that is the result of inverting the control signal C1 by an inverter INV1 are input, respectively; a NOR gate NOR1 having first and second input terminals to which the data from the data source 30 and the control signal C1 are input, respectively; an exclusive-OR gate EXOR1 having first and second input terminals to which the output of the NAND gate NAND1 and the control signal C2 are input, respectively; an exclusive-OR gate EXOR3 to which the output of the NOR gate NOR1 and the control signal C2 are input, respectively; an exclusive-OR gate EXOR2 having first and second input terminals to which the output of the NAND gate NAND1 and the control signal C3 are input, respectively; and exclusive-OR gate EXOR4 having first and second input terminals to which the output of the NOR gate NOR1 and the control signal C3 are input, respectively. The outputs of the exclusive-OR gates EXOR1 and EXOR2 are connected to the gates of the P-channel MOS transistors MP11 and MP12, respectively, and the outputs of the exclusive-OR gates EXOR3 and EXOR4 are connected to the gates of the N-channel MOS transistors MN11 and MN12, respectively. The MOS transistor MP11 and resistor R11, MOS transistor MN11 and resistor R12, MOS transistor MP12 and resistor R13, and MOS transistor MN12 and resistor R14 are designed in such a manner that the resistance value of each of these series circuits will be, e.g., 100 ohms, when the MOS transistor is turned on.

Figure 3:
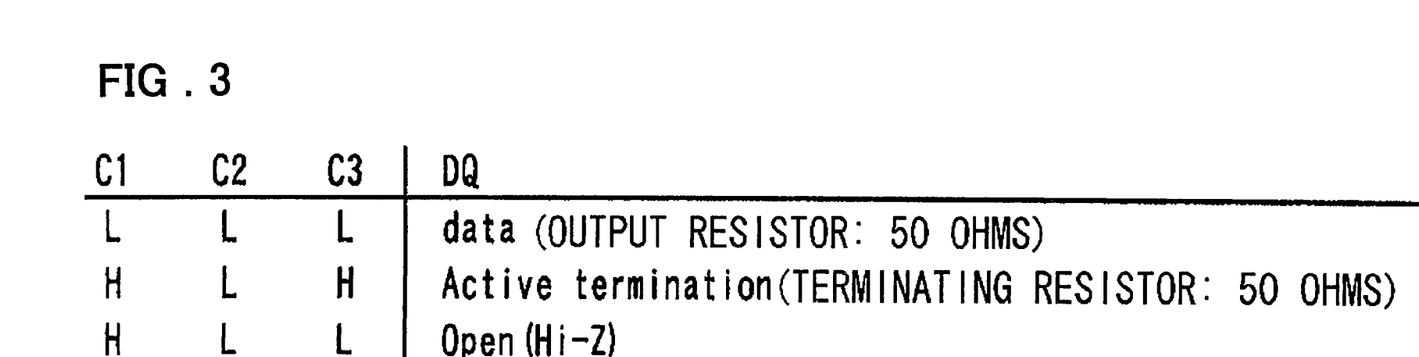
FIG. 3 is a diagram useful in describing the operation of the control circuit according to the first embodiment.

The control signals C1, C2 and C3 and basic operation of the input/output circuit are as shown in FIG. 3. The basic operation comprises a data output mode, a terminating operation (active termination) and a high-impedance (open) state. Operation will now be described.

(1) Data Output Mode (C1, C2, C3=L, L, L)

When the control signal C2 is at the low (L) level, the exclusive-OR gates EXOR1 and EXOR3 having the control signal C2 applied to their second input terminals output the logic values of the signals, which are applied to their respective first input terminals, from their output terminals as is. When the control signal C3 is at the low level, the exclusive-OR gates EXOR2 and EXOR4 having the control signal C3 applied to their second input terminals output the logic values of the signals, which are applied to their respective first input terminals, from their output terminals as is.

The output of the NAND gate NAND1 is supplied to the first input terminal of each of the exclusive-OR gates EXOR1 and EXOR2, and the high level, which is the signal obtained on inverting the low-level control signal C1 by the inverter INV1, is supplied to the second input terminal of the NAND gate NAND1. The NAND1 outputs a signal obtained on inverting the logic value of the data applied to its first input terminal.

The output of the NOR gate NOR1 is supplied to the first input terminal of each of the exclusive-OR gates EXOR3 and EXOR4, and the NOR gate NOR1 has the low-level control signal C1 applied to its second input terminal. The NOR gate NOR1 outputs a signal obtained on inverting the logic value of the data applied to its first input terminal. Accordingly, signals obtained on inverting the data from the data source 30 are supplied to the gates of the P-channel MOS transistors MP11 and MP12 and N-channel MOS transistors MN11 and MN12 from the exclusive-OR gates EXOR1 and EXOR2, and exclusive-OR gates EXOR3 and EXOR4, respectively.

In other words, in the data output mode, the P-channel MOS transistor MP12 operates as a high-level drive transistor and the N-channel MOS transistor MN12 as a low-level drive transistor, and the series circuit comprising the P-channel MOS transistor MP12 and resistor R13 and the series circuit comprising the resistor R14 and N-channel MOS transistor MN12 function as an output buffer together with the P-channel MOS transistor MP11 and N-channel MOS transistor MN11. The high-level drive P-channel MOS transistors MP11 and MP12 are connected to the input/output pin DQ via the resistors R11 and R13, respectively, and the low-level drive P-channel MOS transistors MN11 and MN12 are connected to the input/output pin DQ via the resistors R12 and R14, respectively. By making the resistance values of the resistors R11 and R12 substantially equal as well as the resistance values of the resistors R13 and R14, the output impedance in the case of the high-level output and that in the case of the low-level output can be made substantially equal. This makes it possible to prevent signal from being reflected again on the side of the transmitting end and to transmit the signal without distortion. It should be noted that the circuit described in the specification of, e.g., Japanese Patent Kokai Publication JP-A-7-86909 is an example of an output circuit so constructed that an output is extracted from the point of connection between a series circuit comprising a bipolar transistor for high-level drive and a resistor and a series circuit comprising a bipolar transistor for low-level drive and a resistor.

(2) Terminating Operation (C1, C2, C3=H, L, H)

When the control signal C1 is at the high (H) level, the output of the inverter INV1 falls to the low level and the output of the NAND gate NAND1 is fixed at the high level irrespective of the logic value of the data from the data source 30. The output of the NOR gate NOR1 is fixed at the low level.

If the control signal C2 is at the low level and the control signal C3 is at the high level, the exclusive-OR gates EXOR1 and EXOR3 deliver the output (high level) of the NAND gate NAND1 and the output (low level) of the NOR gate NOR1 to the gates of the P-channel MOS transistor MP11 and N-channel MOS transistor MN11, respectively, as is. The exclusive-OR gates EXOR2 and EXOR4 output the inverse (low level) of the output of NAND gate NAND1 and the inverse (high level) of the output of the NOR gate NOR1 to the gates of the P-channel MOS transistor MP12 and N-channel MOS transistor MN12, respectively.

As a result, the MOS transistors MP11 and MN11 are turned off and the MOS transistors MP12 and MN12 are turned on. That is, the output of the output buffer, which is comprised of the MOS transistor MP11 and resistor R11 and the resistor R12 and MOS transistor MN11 in the combined output driver and terminating circuit 15, is set in a high impedance state(the output buffer is placed in the output-disable state) and the terminating circuit comprising MOS transistor MP12 and resistor R13 and the resistor R14 and MOS transistor MN12 is placed in the operating state.

(3) High-Impedance State (C1, C2, C3=H, L, L)

When the control signal C1 is at the high level, the output of the inverter INV1 falls to the low level and the output of the NAND gate NAND1 attains the high level irrespective of the logic value of the data from the data source 30. The output of the NOR gate NOR1 assumes the low level. If the control signal C2 is at the low level and so is the control signal C3, the exclusive-OR gates EXOR1 and EXOR2 deliver the output (high level) of the NAND gate NAND1 as is to the gates of the P-channel MOS transistors MP11 and MP12. The exclusive-OR gates EXOR3 and EXOR4 deliver the output (low level) of the NOR gate NOR1 as is to the gates of the N-channel MOS transistors MN11 and MN12.

The MOS transistors MP11 and MP12 and the MOS transistors MN11 and MN12 all turn off (the high impedance state). In this case, the terminating circuit comprising the MOS transistor MP12 and resistor R13 and the resistor R14 and MOS transistor MN12 does not operate.

With regard to the control signals C1, C2, and C3, control is exercised on the side of the circuit that generates the controls signals C1, C2, and C3 in such a manner that combinations other than those mentioned above will not occur.

In the above embodiment, part of the output buffer and the terminating circuit are shared as a common portion in terms of the circuit structure. In the output mode, this common portion functions as an output buffer. In the input mode, the common portion functions as a terminating circuit. This circuit arrangement reduces the scale of the circuitry and holds down an increase in the area occupied.

A second embodiment of the present invention will be described in the below. FIG. 4 is a circuit diagram illustrating the structure of a reference-voltage generating circuit 40 according to the second embodiment of the present invention. As shown in FIG. 4, a terminating circuit 50 corresponds to the arrangement comprising the transistor MP12, resistors R13, R14 and transistor MN12 shown in FIG. 1B.

The reference-voltage generating circuit 40 according to this embodiment has a circuit arrangement the same as that of the terminating circuit according to the first embodiment. More specifically, as shown in FIG. 4, the reference-voltage generating circuit 40 includes a P-channel MOS transistor MP41 having a source connected to the high-potential power supply VDDQ and a gate connected to the low-potential power supply GND; a resistor R41 having one end connected to the drain of the P-channel MOS transistor MP41 and its other end connected to the reference voltage Vref; a resistor R42 having one end connected to the reference voltage Vref; and an N-channel MOS transistor MN41 having a drain connected to the other end of the resistor R42, a source connected to the low-potential power supply GND and a gate connected to the high-potential power supply VDDQ. The reference voltage Vref output from the reference-voltage generating circuit 40 is equal to the voltage at the input/output pin DQ in the absence of a signal input, and the logical threshold value of the signal at the input/output pin DQ is applied as the reference voltage Vref.

If the MOS transistors MP41 and MN41 are placed in the ON state, the respective ON resistances are represented by rONP and rONN and the resistance values of the resistors R41 and R42 are represented by r41 and r42, then the reference voltage Vref will be given by the following equation:

$$Vref=\{(r42+rONN)/(r41+rONP+r42+rONN)\}VDDQ$$

When r41+r ONP=r42+r ONN holds, then we have Vref=VDDQ/2

As shown in FIG. 4, a by-pass capacitor 11 is provided between the input terminal of the input buffer 10 to which the reference voltage Vref is applied and the low potential power supply. The fact that the by-pass capacitor 11 is incorporated within the chip also is one of features of this embodiment. The by-pass capacitor 11 may be composed by a MOS capacitor or the like. The reference voltage Vref output from the reference-voltage generating circuit 40 is supplied to the input buffer 10 by the internal wiring of the chip.

The reference-voltage generating circuit 40 is formed on the same semiconductor chip as that having the input buffer 10 and terminating circuit 50. In case of a chip-to-chip variation owing to a fabrication process, therefore, a mismatch will not occur because the logic threshold value and reference voltage are matched. For example, the voltage at the input/output pin DQ in the absence of a signal input, varies, owing to a variation in the fabrication process of the terminating circuit 50, and a variation in the sensitivity of the terminating circuit 50 to the power supply voltage and temperature. In this embodiment, however, the voltage at the connection node between the input/output pin DQ and the resistors R51 and R52 of the terminating circuit 50 is adopted as the reference voltage Vref and hence the reference voltage Vref can be made to follow up a fluctuation in the logic threshold value of the signal (referred to as a "DQ signal") transmitted via the input/output pin DQ. As a result, mismatch between the reference voltage Vref and the logic threshold value of the DQ signal is reduced and the timing precision of the input signal can be improved. Further, it is unnecessary to provide the reference-voltage generating circuit external to the chip, unlike the conventional circuit of FIG. 9.

Figure 5:
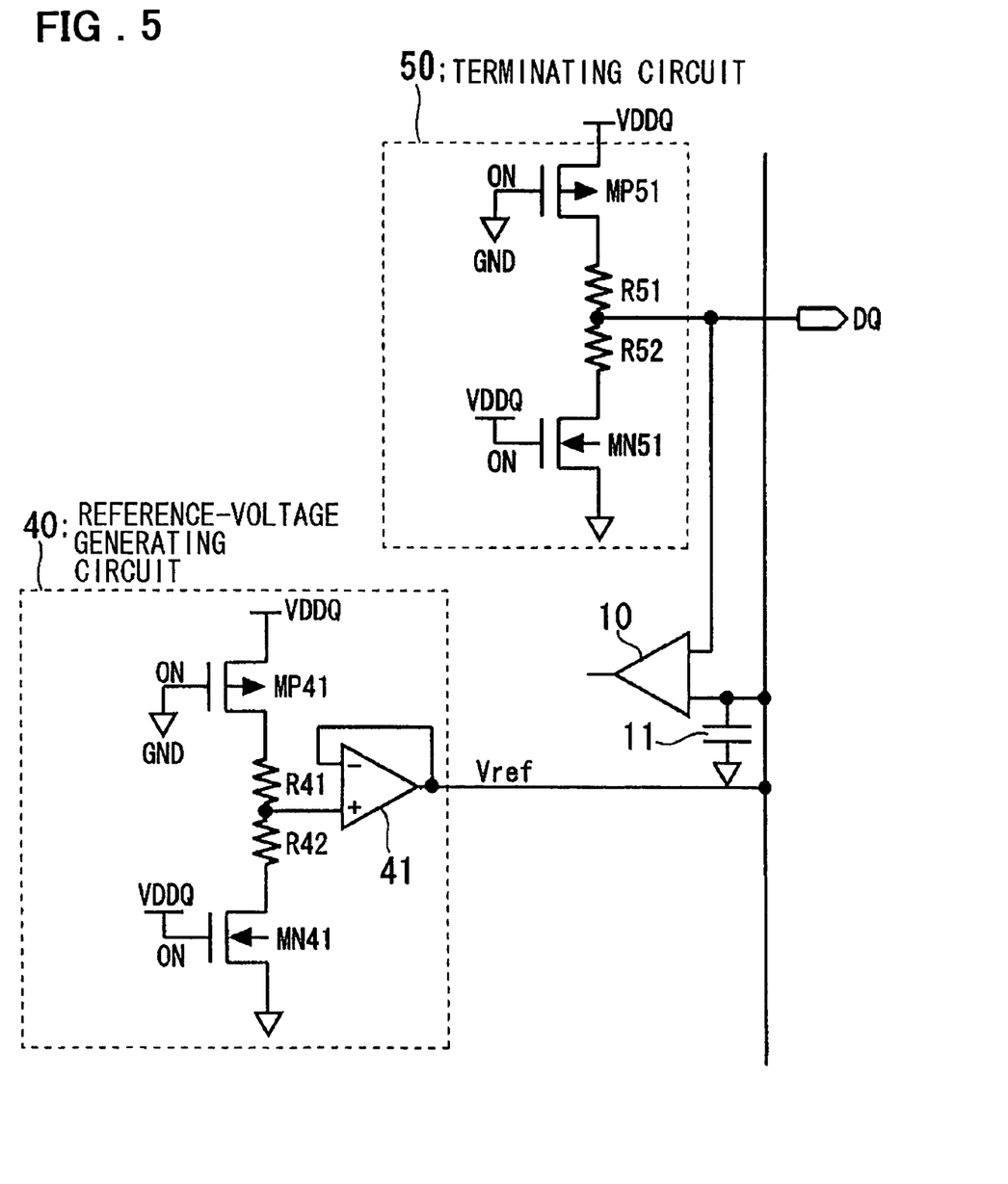
FIG. 5 is a circuit diagram illustrating the structure of a reference-voltage generating circuit according to a third embodiment of the present invention.

FIG. 5 illustrates the structure of a third embodiment of the present invention. This illustrates another structure of a circuit for generating the reference voltage Vref. As shown in FIG. 5, the circuit for generating the reference voltage Vref according to the present embodiment has an operational amplifier 41 that functions as a voltage follower. The operational amplifier 41 has a non-inverting input terminal (+) which is connected to the connection node of resistors R41 and R42, and an output terminal which is connected to its inverting input terminal (−). The output voltage of this voltage follower is supplied to the input buffer 10 as the reference voltage Vref. By virtue of this arrangement, the voltage follower exercises control in such a manner that the output voltage thereof is held equal to the reference voltage applied to the non-inverting input terminal (+), regardless of the effects of noise or the like, and thus the reference voltage supplied to the input buffer 10 is held fixed.

Figure 6:
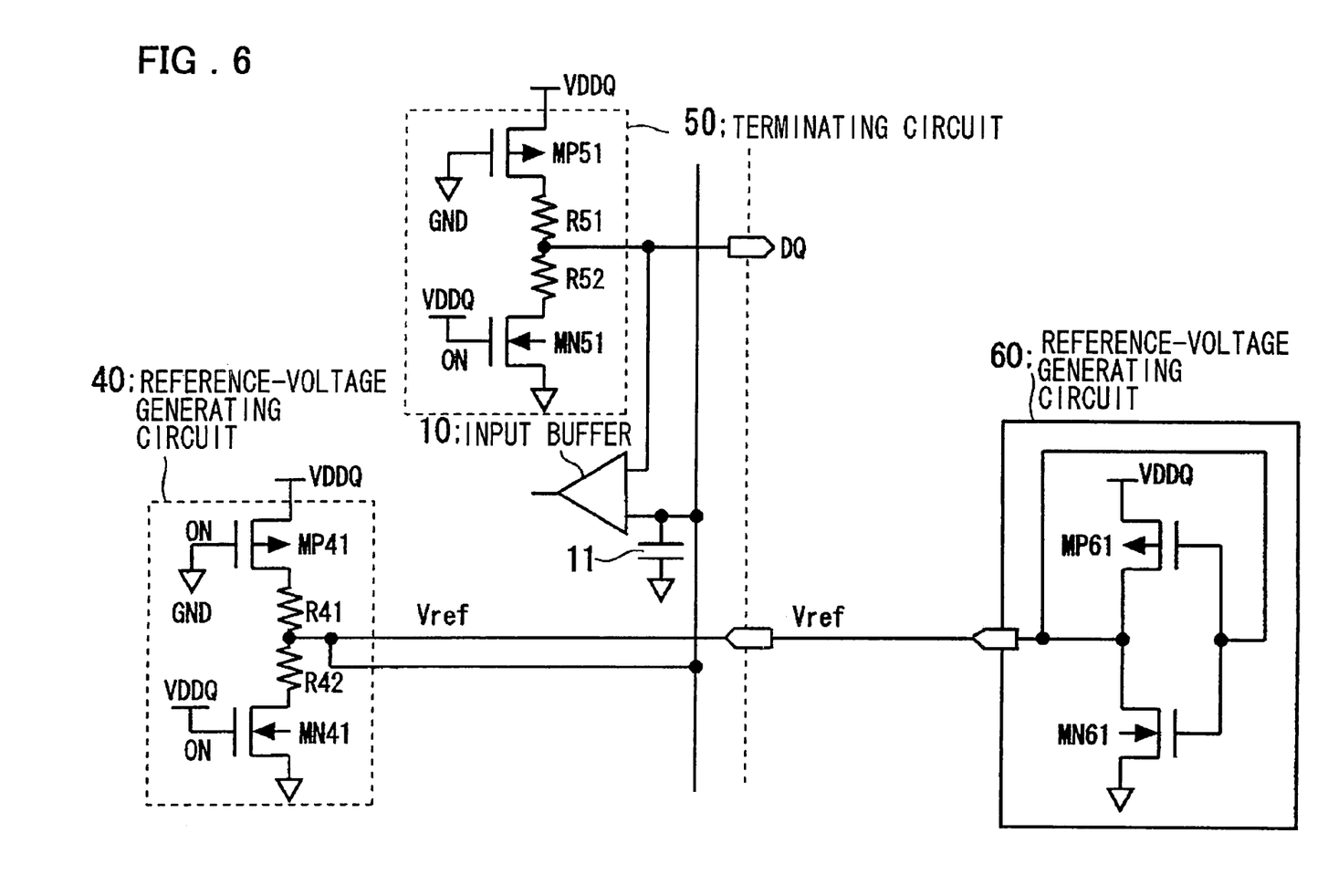
FIG. 6 is a circuit diagram illustrating the structure of a reference-voltage generating circuit according to a fourth embodiment of the present invention.

FIG. 6 illustrates the structure of a fourth embodiment of the present invention and shows another structure of a circuit for generating the reference voltage Vref. As shown in FIG. 6, the voltage at the connection node between the resistors R41 and R42 of the reference-voltage generating circuit 40 is supplied to the input buffer 10 as the reference voltage Vref, and the connection node between the between the resistors R41 and R42 is connected to an external terminal (pin) Vref. The latter is connected to a dummy output circuit 60 of another chip by wiring (DQ dummy wiring). Since the dummy output circuit 60 of the other chip functions as a circuit for generating the reference voltage, it is illustrated as reference-voltage generating circuit 60. The dummy output circuit (reference-voltage generating circuit) 60 comprises a CMOS inverter whose input and output nodes are connected together. More specifically, the reference-voltage generating circuit 60 includes a P-channel MOS transistor MP61 whose source is connected to the high-potential power supply VDDQ, and an N-channel MOS transistor MN61 whose drain is connected to the drain of the P-channel MOS transistor MN61 and whose source is connected to the low-potential power supply GND. The input node, to which the gates of the MOS transistors MP61, MN61 are connected in common, is connected to the output terminal (the node at which the drains of the MOS transistors MP61 and MN61 are connected in common. The output voltage of the reference-voltage generating circuit 60 is one-half the high-potential power supply voltage VDDQ. It should be noted that the reference-voltage generating circuit 60 is not limited to a CMOS inverter. For example, the circuit 60 may be constructed from a P-channel MOS transistor and resistor connected in series between the high-potential power supply VDDQ and output terminal, and a resistor and an N-channel MOS transistor connected in series between the output terminal and the low-potential power supply GND. The gates of the p- and N-channel MOS transistors would be tied together and connected to the output terminal.

In this embodiment, the output voltage (e.g., VDDQ/2) of the dummy output circuit 60 on the other chip that sends and receives the DQ signal is utilized as the reference voltage of the input buffer 10. As a result, this embodiment is capable of dealing with a case where the logic threshold value of the DQ signal is not decided by the terminating circuit 50 alone.

Figure 7:
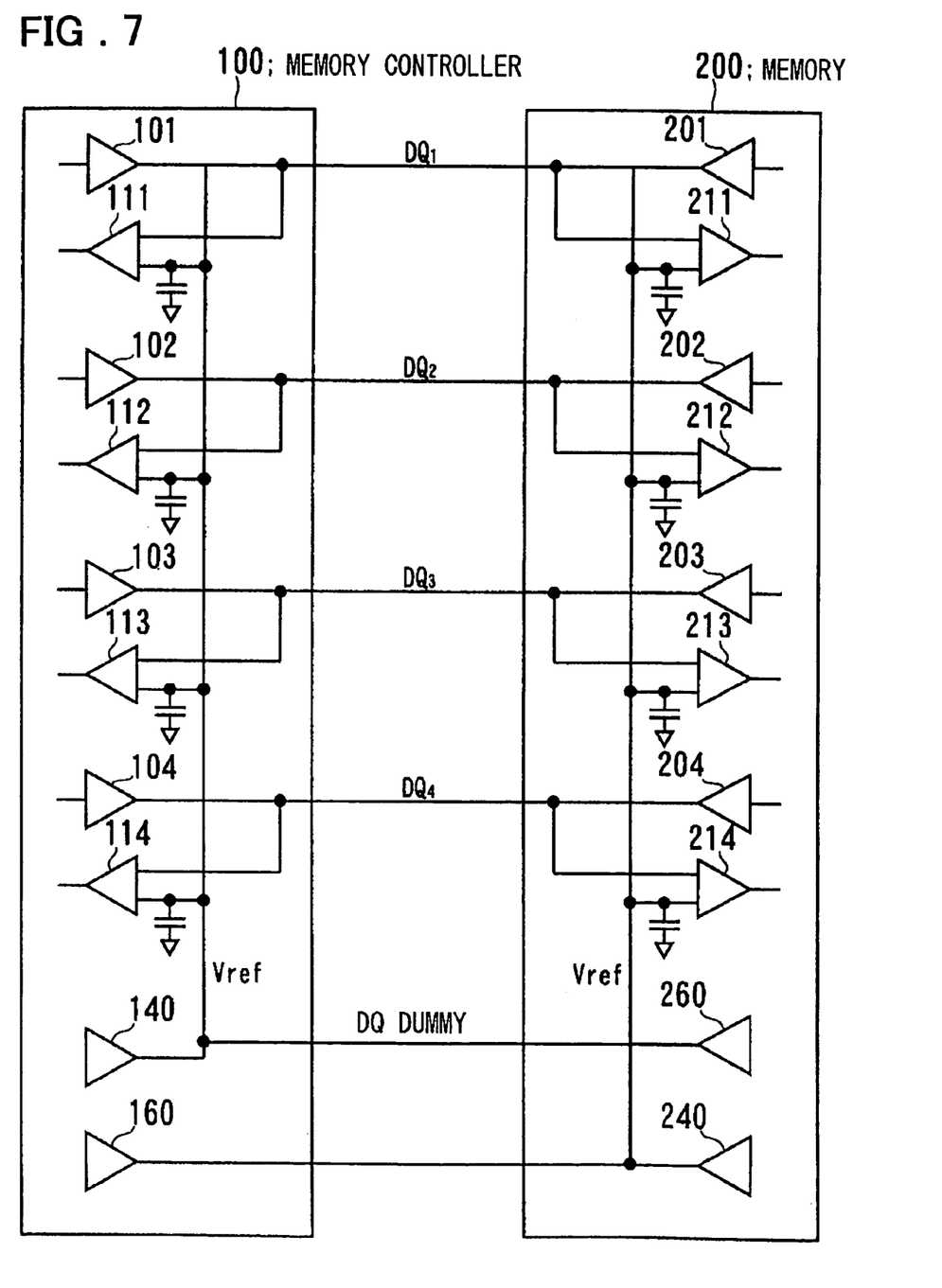
FIG. 7 is a circuit diagram illustrating an example of an interface according to a fifth embodiment of the present invention.

FIG. 7 illustrates the structure of a fifth embodiment of the present invention. This shows the structure of an interface circuit that incorporates art of several of the embodiments described above. As shown in FIG. 7, data is sent and received between a memory controller 100 and a memory 200. The memory controller 100 has a plurality of input/output circuits (I/O cells) from a cell comprising an output buffer 101 and an input buffer 111 to a cell comprising an output buffer 104 and an input buffer 114, a reference-voltage generating circuit 140, and a dummy driver 160 functioning as a reference-voltage generating circuit.

The memory 200 has a plurality of input/output circuits (I/O cells) from a cell comprising an output buffer 201 and an input buffer 211 to a cell comprising an output buffer 204 and an input buffer 214, a reference-voltage generating circuit 240, and a dummy driver 260.

The output buffers 101 to 104 in the memory controller 100 are constructed to have a terminating circuit of the kind described above with reference to FIGS. 1 and 2, and the reference-voltage generating circuit 140 is implemented as described with reference to FIG. 6. The reference-voltage generating circuit 140 supplies the plurality of input buffers 111 to 114 with the reference voltage Vref and is connected to the dummy driver 260 in the memory 200 via DQ dummy wiring.

The output buffers 201 to 204 in the memory 200 are constructed to have a terminating circuit of the kind described above with reference to FIGS. 1 and 2, and the reference-voltage generating circuit 240 is composed of the circuit as described with reference to FIG. 6. The reference-voltage generating circuit 240 supplies the plurality of input buffers 211 to 214 with the reference voltage Vref and is connected to the dummy driver 160 in the memory controller 100 via DQ dummy wiring.

The dummy drivers 160 and 260 are each composed of the reference-voltage generating circuit 60 comprising the dummy output circuit (the driver whose input and output are connected together) shown in FIG. 6.

A memory device according to a sixth embodiment of the present invention will now be described.

Figure 8A:
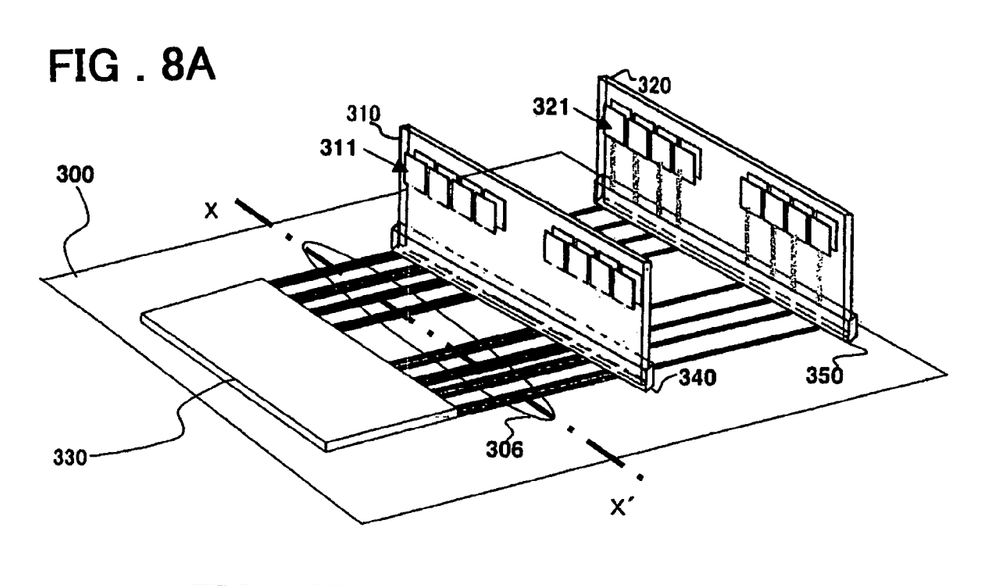
Figure 8B:
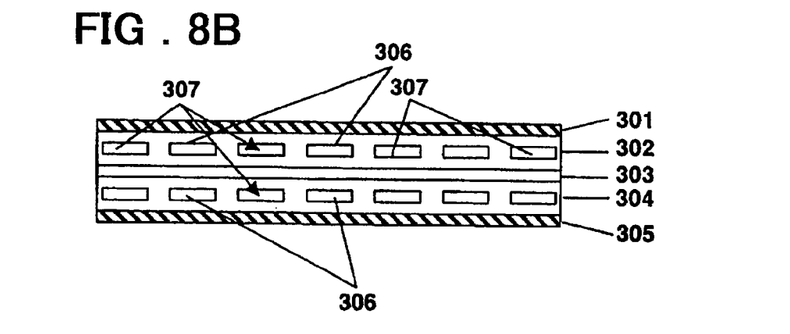

FIGS. 8A and 8B are diagrams illustrating an example of a memory device according to a sixth embodiment of the present invention. Specifically, an example of a point-to-point memory bus interface is illustrated, in which FIG. 8A is a perspective view illustrating components mounted on a printed circuit board, and FIG. 8B a sectional view illustrating a cross section of the memory bus (signal wiring) of the circuit board, the section being taken along line X–X' in FIG. 8A.

Referring to FIG. 8A, the memory device includes a printed circuit board 300, a memory controller 330 mounted on the printed circuit board 300, first and second connectors 340 and 350 mounted on the printed circuit board 300, and first and second memory modules 310 and 320 inserted into the first and second connectors 340, and 350, respectively. A plurality of DRAMs (dynamic random-access memories) 311, 321 are mounted on the memory modules 310 and 320, respectively. Data, address and command bus pins of the memory controller 330 and corresponding data, address and command bus pins of each of the DRAMs are connected to each other in one-to-one correspondence by data, address and command bus signal wiring 306.

Referring to FIG. 8B, the printed circuit board 300 consists of a GND (ground) layer 301, a signal layer 302, a VDD (power supply layer) 303, a signal layer 304 and a GND layer 305. The bus signal wiring (data, address and command bus signal wiring) 306 is disposed in the signal layers 302 and 304. The signal layer 302 is sandwiched between the GND layer 301 and VDD layer 303, and the signal layer 304 is sandwiched between the VDD layer 303 and GND layer 305. Shields 307 are formed between mutually adjacent wiring in the same signal layer to reduce crosstalk between the signal wiring.

In the arrangement shown in FIGS. 8A and 8B, at least one of the input/output circuits (not shown) connected to data pins of the memory controller 330 and at least one of the input/output circuits (not shown) connected to data-signal input/output pins (DQ pins) of the DRAMs 311, and 312 is so adapted that part of the output circuit is made to function as a terminating circuit at the time of a signal input. In other words, the input/output circuit is implemented according to any of the embodiments described above with reference to FIGS. 1 to 7. Further, in the memory controller 330 and DRAMs 311 and 321, a reference-voltage generating circuit that supplies reference voltage to an input buffer to which an input signal and the reference voltage are input differentially may be constructed as described above with reference to FIGS. 6 to 8.

Though the present invention has been described in accordance with the foregoing embodiments, the invention is not limited to these embodiments and it goes without saying that the invention covers various modifications and changes that would be obvious to those skilled in the art within the scope of the claims. For example, the present invention is applicable not only to a CMOS process but also to bi-polar devices.

The present invention is not limited to a data signal (DQ signal) as the bi-directional signal in a memory interface, for example. It goes without saying that the invention is applicable also to an input circuit or input/output circuit for an address signal and control signal (command signal), etc.

Further, the present invention is not limited solely to an input/output interface in a semiconductor integrated circuit and obviously is applicable also to an input/output interface circuit provided on a printed circuit board.

Further, in the present invention, such a circuit configuration may be also adopted in which one of two-number of series circuits each consisting of a transistor and resister connected serially between an input/output terminal and a power supply functions as a terminating circuit.

The meritorious effects of the present invention are summarized as follows.

Thus, in accordance with the present invention as described above, part of an output circuit is adapted to function also as a terminating circuit, thereby making it unnecessary to provide a terminating circuit separate from the output circuit. This has the effect of making it possible to reduce the space occupied by the terminating circuit and output circuit. In accordance with the present invention, it is possible to reduce the chip area of a semiconductor integrated circuit device having an input/output circuit equipped with a terminating circuit.

Further, in accordance with the present invention, a resistance is inserted between the output drive transistor and output node of an output circuit, as a result of which the impedance of the signal source of the output circuit and the characteristic impedance of a transmission line are made to match. This raises signal quality by preventing a reflected signal from being reflected again at the time of signal output.

In the present invention, the voltage at a connection node between a signal input terminal and a terminating resistor in a terminating circuit is adopted as a reference voltage so that it is possible to follow up a fluctuation in the logical threshold value of an input signal. As a result, mismatch between the reference voltage and the logical threshold value of the input signal is reduced, thereby making it possible to improve the timing precision of the input signal.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A reference-voltage generating circuit for generating a voltage to supply the generated voltage as a reference voltage to an input circuit of an input/output circuit, said input/output circuit having an output circuit comprising:
    a first series circuit including a first transistor and a first resistor connected serially between a high-potential power supply and an input/output pin;
    a second series circuit including a second transistor and a second resistor connected serially between the input/output pin and a low-potential power supply; and
    control means for turning on the first and second transistors based upon a control signal at the time of a signal input from the input/output pin to said input circuit, thereby causing said first and second series circuits to operate a terminating circuit of a line connected to the input/output pin;
    wherein said reference-voltage generating circuit comprises a circuit for generating the reference voltage equal to a voltage, which prevails in the absence of an applied signal, at a connection node between the input/output pin and said first and second series circuits composing said terminating circuit in the input/output circuit.

2. A semiconductor integrated circuit which sends and receives signals to and from a semiconductor integrated circuit having the reference-voltage generating circuit set forth in claim 1, comprising a reference circuit having input and output terminals connected together;
    the output terminal of said reference circuit being connected to the reference-voltage output terminal of said reference-voltage generating circuit.

3. A memory device comprising the reference-voltage generating circuit set forth in claim 1.

4. A reference-voltage generating circuit for supplying an input circuit, which receives differentially an input signal from an input terminal and a reference voltage, said reference-voltage generating circuit comprising:
    a first series circuit including a first transistor and a first resistor connected serially between a high-potential power supply and a reference-voltage output terminal; and
    a second series circuit including a second transistor and a second resistor connected serially between the reference-voltage output terminal and a low-potential power supply;
    wherein the first and second transistors are set to an ON state to output the reference voltage from the reference-voltage output terminal.

5. The reference-voltage generating circuit according to claim 4, further comprising an operational amplifier having an output terminal, a non-inverting input terminal for receiving the reference voltage output from the reference-voltage output terminal, and an inverting input terminal to which said output terminal is connected;
    wherein an output signal from the output terminal of said operational amplifier is supplied to said input circuit as the reference voltage.

6. The reference-voltage generating circuit according to claim 4, wherein the reference-voltage output terminal of said reference-voltage generating circuit is connected to an output terminal of a reference circuit, said reference circuit having input and output terminals being connected together.

7. A memory device comprising the reference-voltage generating circuit set forth in claim 4.

* * * * *